United States Patent
Tsutsumi et al.

(10) Patent No.: US 8,801,234 B2
(45) Date of Patent: Aug. 12, 2014

(54) LIGHT EMITTING MODULE AND OPTICAL WAVELENGTH CONVERTING MEMBER

(75) Inventors: Yasuaki Tsutsumi, Shizuoka (JP); Takashi Onishi, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 103 days.

(21) Appl. No.: 13/085,859

(22) Filed: Apr. 13, 2011

(65) Prior Publication Data

US 2011/0255264 A1    Oct. 20, 2011

(30) Foreign Application Priority Data

Apr. 14, 2010    (JP) ................... 2010-092835

(51) Int. Cl.
```
F21V 5/00      (2006.01)
F21V 5/04      (2006.01)
F21Y 101/02    (2006.01)
F21V 7/00      (2006.01)
```

(52) U.S. Cl.
CPC ............... *F21V 5/04* (2013.01); *F21Y 2101/02* (2013.01); *F21V 7/0091* (2013.01)
USPC .................. 362/326; 362/311.01; 362/311.15; 362/311.06; 362/555; 362/511; 257/95; 257/98; 257/99

(58) Field of Classification Search
CPC ...... F21V 5/04; F21V 7/0091; F21Y 2101/02
USPC ........... 362/84, 317, 509–510, 280, 293, 348; 257/98, 99
See application file for complete search history.

(56) References Cited

U.S. PATENT DOCUMENTS

| | | | |
|---|---|---|---|
| 7,361,938 B2* | 4/2008 | Mueller et al. | 257/94 |
| 2003/0008144 A1* | 1/2003 | Whitney et al. | 428/402 |
| 2007/0224714 A1* | 9/2007 | Ikeda et al. | 438/26 |
| 2008/0121911 A1* | 5/2008 | Andrews et al. | 257/98 |

(Continued)

FOREIGN PATENT DOCUMENTS

| | | |
|---|---|---|
| JP | 2006-005367 A | 1/2006 |
| JP | 2007-059864 A | 3/2007 |
| JP | 2007-324220 A | 12/2007 |
| JP | 2010-510659 A | 4/2010 |

OTHER PUBLICATIONS

Takeharu Okuno, "High Performance Reflection Preventing Film based upon Sub-wavelength Structure", Japan Opto-Mechatronics Association, vol. 47, No. 2, 2009, pp. 83-88.

(Continued)

*Primary Examiner* — Thomas Sember
*Assistant Examiner* — Tsion Tumebo
(74) *Attorney, Agent, or Firm* — Sughrue Mion, PLLC

(57) ABSTRACT

A light emitting module is provided with a light emitting element and an optical wavelength converting member. The optical wavelength converting member includes a light incident plane, a light output plane, and an outer plane which is a plane except for said light incident plane and said light output plane. The optical wavelength converting member converts a wavelength of light emitted on the light emitting element and entered from the light incident plane into the optical wavelength converting member and outputs the wavelength-converted light from the light output plane. An average roughness "Ra" of at least a portion of the outer plane is lower than an average roughness of the light output plane.

14 Claims, 5 Drawing Sheets

(56) References Cited

U.S. PATENT DOCUMENTS

2008/0128730 A1* 6/2008 Fellows et al. ............... 257/98
2009/0039369 A1* 2/2009 Niino et al. .................. 257/98
2009/0321759 A1* 12/2009 Xu .............................. 257/98
2011/0079800 A1* 4/2011 Konno ......................... 257/95

OTHER PUBLICATIONS

Notification of Reasons for Refusal, dated Dec. 17, 2013, issued by the Japanese Patent Office in counterpart Japanese Application No. 2010-092835.

* cited by examiner

FIG.5

| | COMPARISON EXAMPLE 1 | COMPARISON EXAMPLE 2 | COMPARISON EXAMPLE 3 | COMPARISON EXAMPLE 4 | EXAMPLE 1 | EXAMPLE 2 | EXAMPLE 3 |
|---|---|---|---|---|---|---|---|
| LIGHT OUTPUT PLANE 52a Ra[μm] | 0.020 | 0.020 | 0.020 | 0.020 | 0.600 | 0.600 | 0.600 |
| SIDE PLANE 52b Ra[μm] | 2.000 | 0.300 | 0.070 | 0.020 | 0.300 | 0.070 | 0.020 |
| LIGHT OUTPUT PLANE PHOTON RATIO | 1.00 | 0.98 | 0.98 | 0.94 | 1.35 | 1.36 | 1.37 |
| SIDE PLANE PHOTON RATIO | 2.90 | 2.92 | 2.80 | 2.61 | 2.51 | 2.39 | 1.83 |
| LIGHT OUTPUT PLANE / SIDE PLANE | 0.34 | 0.34 | 0.35 | 0.36 | 0.54 | 0.57 | 0.75 |

LIGHT EMITTING MODULE AND OPTICAL WAVELENGTH CONVERTING MEMBER

BACKGROUND OF THE INVENTION

1. Field of the Invention

The present invention relates to a light emitting module and an optical wavelength converting member.

2. Related Art

Recently, as light sources for illuminating high intensity light such as lamp units for illuminating light toward front areas of vehicles in order to achieve purposes of long lifetime and reductions of power consumption, light emitting modules having light emitting elements such as LEDs (Light Emitting Diodes) have been developed. In order to employ the light emitting modules in such a field, not only emissions of white light by the light emitting modules must be realized, but also high luminance and high luminous flux are required for the light emitting modules. For instance, in order to improve deriving efficiencies of white light, illuminating apparatuses equipped with light emitting elements for mainly emitting blue light, yellow color-series fluorescent members, and blue color-transmitting yellow color-series reflecting means have been developed (refer to, for example, JP-A-2007-059864). In the illuminating apparatuses, the yellow color-series fluorescent members mainly emit yellow light by being excited by the blue light, and the blue color-transmitting yellow color-series reflecting means pass therethrough the blue light emitted from the light emitting elements and reflect thereon light having wavelengths longer than, or equal to those of the yellow light emitted from the yellow-series fluorescent members. Also, for instance, in order to increase converting efficiencies, structural members equipped with ceramic layers disposed within paths of light irradiated by light emitting layers have been proposed (refer to, for example, JP-A-2006-005367).

Also, when projection portions are spread all over a light output plane, it is known that a predetermined relationship is established among wavelengths of light, heights of the projection portions, and reflectance factors (refer to, for instance, non-patent document 1).

<Non-Patent Document 1>

"High Performance Reflection Preventing Film based upon Sub-wavelength Structure" SWC" written by Takeharu Okuno, OPTICAL TECHNICAL CONTACT, pages 83 to 88, Feb. 20, 2009 issued by Japan Opto-Mechatronics Association In such a case that the projection portions have been provided on the light transmitting member, the below-mentioned fact can be revealed: That is, if the height "h" of the projection portions becomes larger than approximately ½ of the wavelength of the light, then the reflectance factor "R" becomes substantially zero %, namely, substantially all of light pass through the light transmitting member. Conversely, when the height "h" of the projection portions becomes smaller than approximately ½ of the wavelength of the light, it is revealed that the smaller the height "h" becomes, the larger the reflectance factor "R" becomes.

For example, as explained in the case that a light emitting module is employed in the above-described lamp unit, in such a case where it is required to realize high illuminance and high luminous intensity while a wavelength of light emitted from a light emitting element is converted, there is a large problem that a deriving efficiency of the light from the light emitting element is improved. However, for example, when an incident angle of light to a light output plane of a fluorescent member becomes larger than a total reflection critical angle, the light is not outputted, but is reflected within the fluorescent member, which may cause a deriving efficiency of the light to be lowered. On the other hand, as to improvements in such a deriving efficiency of light, as explained in the above-described non-patent document 1, there are possibilities that higher deriving efficiencies of light can be realized by considering the relationship between the heights of the projection portions and the reflectance factors. For example, in vehicle-purpose lighting devices, light emitting modules having high luminance are required while light output directions thereof are defined to a single direction. Since light other than light along main light output direction constitutes glares with respect to pedestrians and opposite-direction driving cars, it is required to reduce the first-mentioned light in minimum.

SUMMARY OF THE INVENTION

One or more embodiments of the invention provide light emitting module and an optical wavelength converting member which can realize a high deriving efficiency of light.

In accordance with one or more embodiments, a light emitting module may include a light emitting element; and an optical wavelength converting member.

The optical wavelength converting member may include a light incident plane, a light output plane, and an outer plane which is a plane except for the light incident plane and the light output plane. The optical wavelength converting member may be adapted to convert a wavelength of light emitted on the light emitting element and entered from the light incident plane into the optical wavelength converting member and to output the wavelength-converted light from the light output plane. An average roughness "Ra" of at least a portion of the outer plane may be lower than an average roughness of the light output plane.

The average roughness "Ra" of the portion of the outer plane is smaller than, or equal to 0.3 micrometers.

The average roughness "Ra" of the portion of the outer plane may be smaller than, or equal to ¼ of a central wavelength of said wavelength-converted light.

The optical wavelength converting member may have a shore-D-hardness which is larger than, or equal to 60.

Other aspects and advantages of the invention will be apparent from the following description and the appended claims.

BRIEF DESCRIPTION OF THE DRAWINGS

FIG. 5 is a diagram showing experiment results as to examples 1 to 3 of optical wavelength converting members of the exemplary embodiment, in which combinations between average roughnesses "Ra" of light output planes and average roughnesses "Ra" of side planes are different from each other, and comparison examples 1 to 4.

DETAILED DESCRIPTION OF THE EXEMPLARY EMBODIMENTS

An exemplary embodiment of the invention is described, referring to drawings.

Figure 1:
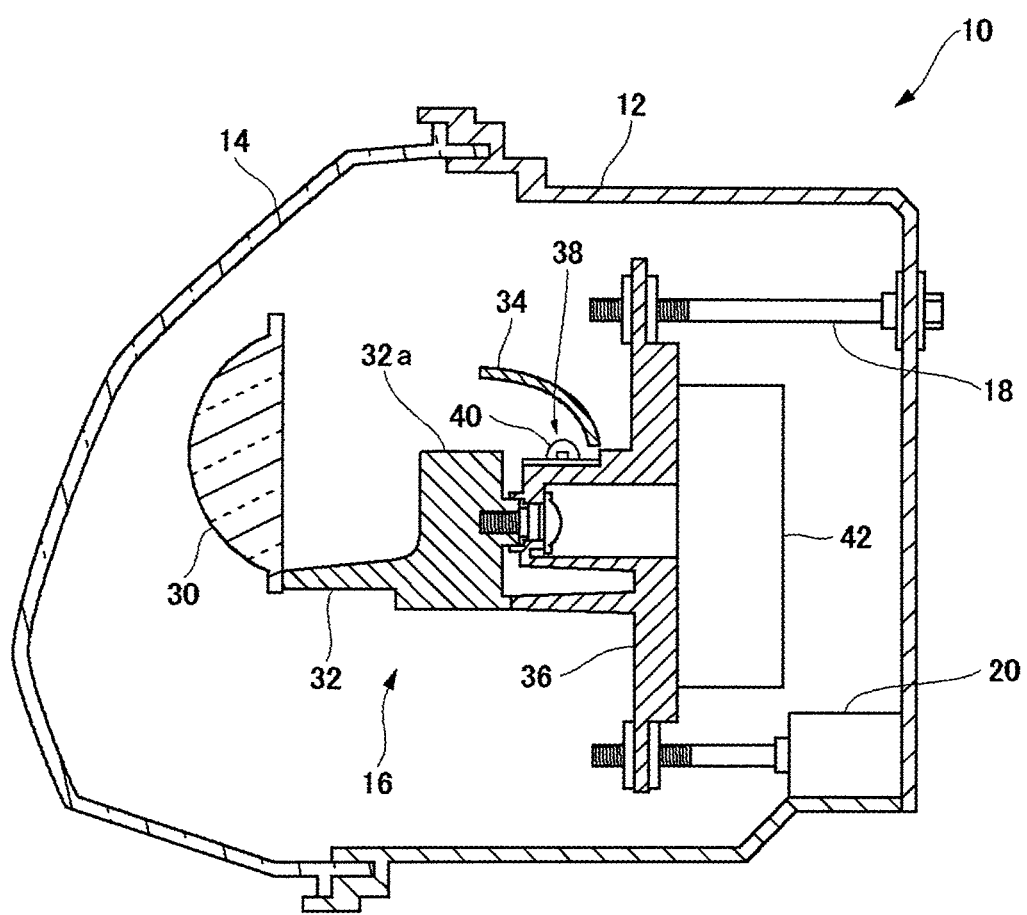
FIG. 1 is a sectional view showing a structure of a vehicle headlamp of an exemplary embodiment.

FIG. 1 is a sectional view for showing a structure of a vehicle headlamp 10 according to an exemplary embodiment. The vehicle headlamp 10 has a lamp body 12, a front cover 14, and a lamp unit 16. In FIG. 1, a front side of the lamp body is indicated in a left of the drawing, and a rear side of the lamp body is indicated in a right of the drawing. Also, as viewed from the rear side to the front side, a right side will be referred to as a right side of the lamp body, and a left side will be referred to as a left side of the lamp body. FIG. 1 shows a sectional view when the vehicle headlamp 10 cut along a vertical plane including an optical axis of the lamp unit 16 is viewed from the left side of the lamp unit. In the case that the vehicle headlamp 10 of the exemplary embodiment is mounted on a vehicle, two vehicle headlamps formed in a right/left symmetrical manner are respectively located in right/left sides of a front side of the vehicle. FIG. 1 indicates any one of the right-sided and left-sided structures of the vehicle headlamps 10.

The lamp body 12 is formed in a box shape having an opening. The front cover 14 is formed in a cup shape made of either a resin or glass, which has a light transmitting characteristic. An edge portion of the front cover 14 is mounted on the opening of the lamp body 12. As a result, a lighting chamber is formed at an area covered by the lamp body 12 and the front cover 14.

The lamp unit 16 is arranged within the lighting chamber. The lamp unit 16 is fixed on the lamp body 12 by aiming screws 18. The lower aiming screw 18 is constructed to be rotated by that a leveling actuator 20 is actuated. As a result, the optical axis of the lamp unit 16 can be moved along upper and lower directions by actuating the leveling actuator 20.

The lamp unit 16 has a projection lens 30, a supporting member 32, a reflector 34, a bracket 36, a light emitting module board 38, and a heat radiating fin 42. The projection lens 30 is constructed of a plane convex aspheric lens in which a surface thereof on the side of front side of the lamp unit is a convex and a flat surface thereof on the side of rear side of the lamp unit is a plane. The projection lens 30 projects a light source image to be formed on a backward focal plane as a reverted image toward the front side of the lamp unit. The supporting member 32 supports the projection lens 30. A light emitting module 40 is provided on the light emitting module board 38. The reflector 34 reflects thereon light from the light emitting module 40 to form a light source image on the backward focal plane of the projection lens 30. As previously described, the reflector 34 and the projection lens 30 function as an optical member which collects light emitted from the light emitting module 40 toward the front side of the lamp unit. The heat radiating fin 42 is mounted on a back-sided plane of the bracket 36, and radiates heat which is mainly generated by the light emitting module 40.

A shade 32a is formed on the supporting member 32. While the vehicle headlamp 10 is employed as a low beam-purpose light source, the shade 32a shades a portion of light emitted from the light emitting module 40 and reflected on the reflector 34, so that the shade 32a forms a cut-off line in a low beam-purpose luminous intensity distribution pattern in the forward area of the vehicle. Since the low beam-purpose luminous intensity distribution pattern is known, the explanation thereof will be omitted.

Figure 2:
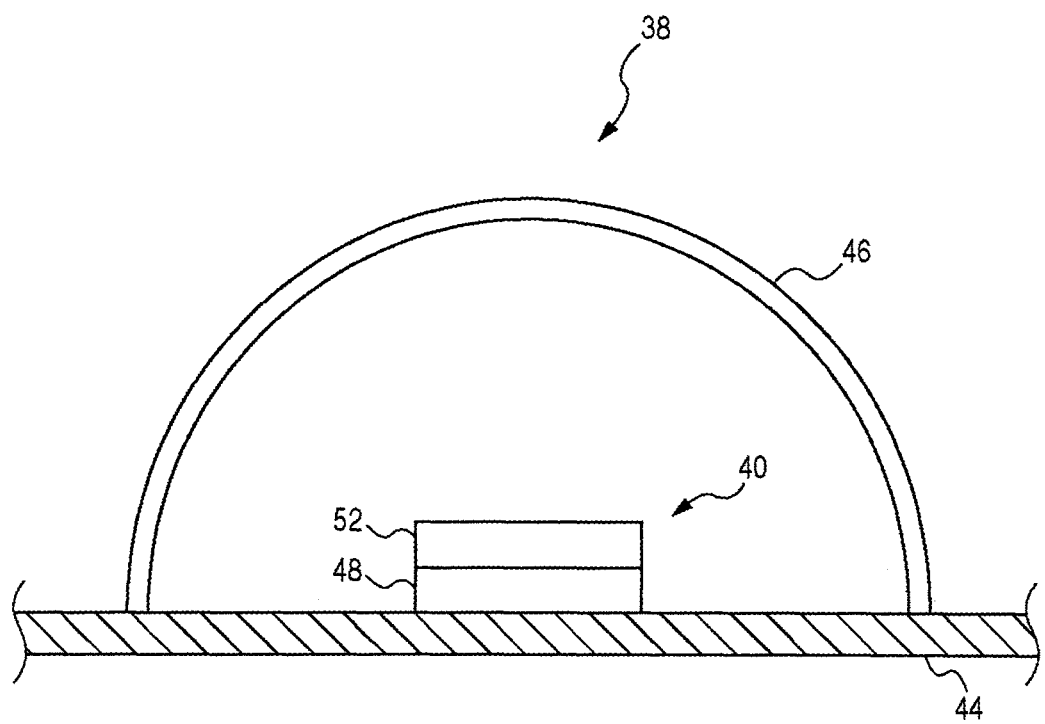
FIG. 2 is a diagram showing a structure of a light emitting module board of the exemplary embodiment.

FIG. 2 is a diagram for showing a structure of the light emitting module board 38 according to the exemplary embodiment. The light emitting module board 38 has a light emitting module 40, a board 44, and a transparent cover 46. The board 44 is a printed circuit board, and the light emitting module 40 is mounted on an upper plane thereof. The light emitting module 40 is covered by a colorless transparent cover 46. In the light emitting module 40, the semiconductor light emitting element 48 is directly mounted on the board 44, and an optical wavelength converting member 52 is arranged on this semiconductor light emitting element 48.

Figure 3:
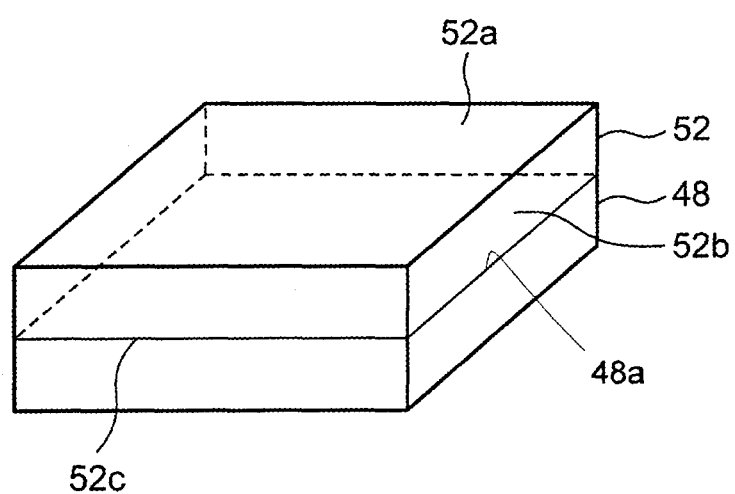
FIG. 3 is a perspective view showing a structure of a light emitting module of the exemplary embodiment.

FIG. 3 is a perspective view for indicating a structure of the light emitting module 40 according to the exemplary embodiment. The semiconductor light emitting element 48 is constructed of an LED element. In the present mode, as the semiconductor light emitting element 48, a blue LED which mainly emits light having a wavelength of a blue is employed. Concretely speaking, the semiconductor light emitting element 48 is constructed of an InGaN-series LED element which is manufactured by crystal-growing an InGaN-series semiconductor layer. The semiconductor light emitting element 48 is formed as, for example, a chip having a 1 mm square, and a central wavelength of emitted blue light is designed to become 470 nm. Apparently, the structure of the semiconductor light emitting element 48 and the wavelength of the emitted light therefrom are not limited only to the above-described structure and wavelength.

As the semiconductor light emitting element 48 according to the exemplary embodiment, a longitudinal chip type of semiconductor light emitting element is employed. This longitudinal chip type semiconductor light emitting element is manufactured by that an n type electrode is formed on a plane thereof which is to be mounted on the board 44, and an n type semiconductor, a p type semiconductor, and furthermore, a p type electrode are stacked on the n type electrode. As a consequence, an electrode corresponding to the p type electrode of the electric conductor is provided on the upper plane, namely, on the light emitting plane side of the semiconductor light emitting element 48. Since such a semiconductor light emitting element 48 is known, a further explanation thereof will be omitted. Apparently, the semiconductor light emitting element 48 is not limited only to the longitudinal chip type, for instance, a face up type may be alternatively employed.

Au-wires are bonded on this electrode. Alternatively, notches used to bond the Au-wires on the electrode may be formed in the optical wavelength converting member 52. Currents required for emitting light are supplied via the Au-wires to the electrode. Instead of the Au-wires, for example, aluminum wires, copper foils, aluminum ribbon wires, or the like may be alternatively employed.

The optical wavelength converting member 52 is so-called as "light emitting ceramics", or "fluorescent ceramics", and can be manufactured by sintering ceramic base materials formed by employing YAG (Yttrium Aluminum Garnet) powder corresponding to a fluorescent member excited by blue light. Since a manufacturing method of such optical wavelength converting ceramics is known, a detailed description thereof will be omitted. The optical wavelength converting member 52 is not limited only to ceramics, but may be alternatively formed by, for instance, glass containing a fluorescent material, or a resin containing a fluorescent material and having a light transmitting characteristic.

The optical wavelength converting material 52 manufactured in the above-described manner converts the wavelength of the blue light which is mainly emitted by the semiconductor light emitting element 48, and outputs yellow light whose central wavelength (peak wavelength) is longer than, or equal to 530 nm and shorter than, or equal to 600 nm. As a result, from the light emitting module 40, synthesized light is outputted, which is produced by synthesizing the blue light directly passed through the optical wavelength converting member 52 with the yellow light whose wavelength has been converted by the optical wavelength converting member 52. Thus, white light can be emitted from the light emitting module 40.

Also, a transparent member is employed as the optical wavelength converting material 52. It is assumed in the exemplary embodiment that the expression "transparent" implies that total light transmittance of light of a converting wavelength region is higher than, or equal to 40%. As a result of research development wholeheartedly made by Inventors of the present invention, the bellow-mentioned fact could be revealed: That is, if such a transparent condition is maintained that total light transmittance of light of a converting wavelength region is higher than, equal to 40%, then the wavelengths of the light could be properly converted by the optical wavelength converting member 52, and decreases of luminous intensity of light passing through the optical wavelength converting member 52 could be properly suppressed. As a consequence, since the optical wavelength converting member 52 is brought into such a transparent condition, the light emitted by the semiconductor light emitting element 48 can be more effectively converted.

While the optical wavelength converting member 52 is made of an organic-series binder-less inorganic substance, durability thereof could be improved, as compared with that in the case that an organic substance such as organic-series binders is contained. As a result, for example, electric power higher than, or equal to 1 W (Watt) can be supplied to the light emitting module 40, so that luminance, luminous intensity, and luminous flux of light emitted by the light emitting module 40 can be increased.

Alternatively, as the semiconductor light emitting element 48, another semiconductor light emitting element for mainly emitting light having a wavelength other than that of the blue light may be employed. Also, in this alternative case, as the optical wavelength converting member 52, another optical wavelength converting member for converting such a wavelength of light which is mainly emitted by this semiconductor light emitting element 48 is employed. Even in this alternative case, the optical wavelength converting member 52 may alternatively convert the wavelength of the light emitted by the semiconductor light emitting element 48 in such a manner that this light may become white light, or light having a wavelength close to the wavelength of the white light by being synthesized with the light having the wavelength, which is mainly emitted by the semiconductor light emitting element 48.

The optical wavelength converting member 52 enters light emitted by the semiconductor light emitting element 48 from a light incident plane 52c, converts a wavelength of the incident light, and then, outputs the wavelength-converted light from a light output plane 52a. However, if an amount of light outputted from a side plane 52b is increased, then, an amount of light outputted from the light output plane 52a is decreased, so that a light deriving efficiency can be hardly increased. As a consequence, the Inventors could direct their attention to an average roughness "Ra" of the side plane 52b. A detailed description is made in relation to FIG. 4.

Figure 4:
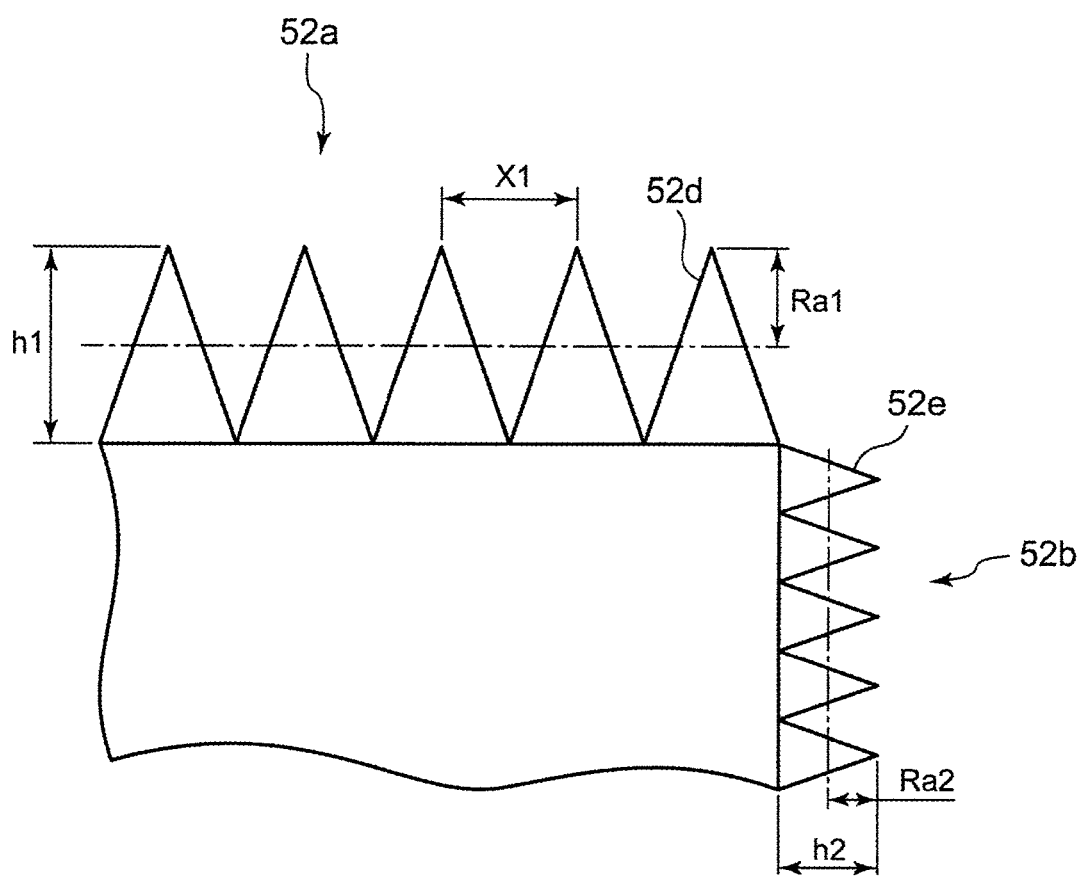
FIG. 4 is a diagram schematically showing conditions of surfaces of a light output plane and a side plane.

FIG. 4 is a diagram for schematically representing conditions of surfaces of the light output plane 52a and the side plane 52b. It is now considered that concaves and convexes of the light output plane 52a are a set of a plurality of first projection portions 52d, and concaves and convexes of the side plane 52b are a set of a plurality of second projection portions 52e. An average height of the first projection portions 52d is assumed as a first height "h1", and an average height of the second projection portions 52e is assumed as a second height "h2." The shapes of the first projection portions 52d and the second projection portions 52e are merely exemplified in order to explain an average roughness "Ra" of each of the light output plane 52a and the side plane 52b, and apparently, the shapes of the first projection portions 52d and the second projection portions 52e are not limited only to these shapes.

In the optical wavelength converting member 52, an average roughness "Ra2" of the side plane 52b corresponding to an outer plane except for both the light incident plane 52d and the light output plane 52a becomes lower than an average roughness "Ra1" of the light output plane 52a. Moreover, in the optical wavelength converting member 52, the average roughness "Ra2" of the side plane 52b is smaller than, or equal to ¼ of a central wavelength of light whose wavelength has been converted by the optical wavelength converting member 52. Since the central wavelength of the light whose wavelength has been converted by the optical wavelength converting member 52 is 600 nm in the exemplary embodiment, the average roughness "Ra2" of the side plane 52b of the optical wavelength converting member 52 is smaller than, or equal to 150 nm which corresponds to ¼ of this central wavelength.

Alternatively, as to the optical wavelength converting member 52, the average roughness "Ra2" of the side plane 52b may become smaller than, or equal to ¼ of the central wavelength of the light emitted from the semiconductor light emitting element 48. Since a central wavelength of the light emitted by the semiconductor light emitting element 48 is 470 nm in the exemplary embodiment, the average roughness "Ra2" of the side plane 52b of the optical wavelength converting member 52 may be smaller than, or equal to 117.5 nm which corresponds to ¼ of this central wavelength.

Figure 6A:
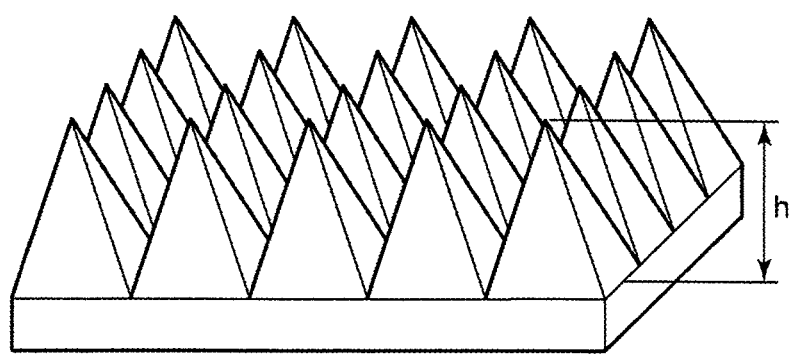
FIG. 6A is a diagram showing an example of a light transmitting member in which projection portions of quadrilateral pyramids whose heights "h" are equal to each other are spread all over in an equi-interval.
Figure 6B:
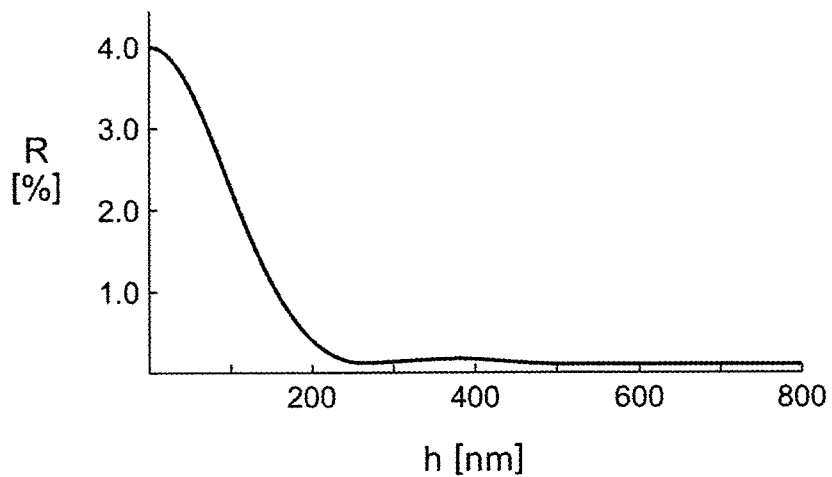
FIG. 6B is a diagram indicating a relationship between the height "h" of the projection portion and a reflectance factor "R" when light having a predetermined central wavelength is illuminated to the light transmitting member shown in FIG. 6A.

FIG. 6A is a diagram for showing an example of the light transmitting member in which projection portions having quadrilateral pyramid shapes, whose heights "h" are equal to each other, are spread all over in an equi-interval. FIG. 6B is a diagram for representing a relationship between the heights "h" of the projection portions and reflectance factors "R" when light having a predetermined central wavelength is illuminated to the light transmitting member shown in FIG. 6A.

An average roughness "Ra" when projection portions are spread all over, as shown in FIG. 6A, becomes h/2. As a consequence, as described above, a second height "h2" of the second projection portions 52e is made smaller than approximately ½ of a wavelength of light, namely, the average roughness "Ra" is made smaller than ¼ of the wavelength of the light, so that a reflectance factor "R" can be increased. As previously described, since the side plane 52b is formed in such a manner that the average roughness "Ra" is obtained by utilizing this characteristic, the light outputted from the side plane 52b can be suppressed and can be again reflected to the inner portion of the optical wavelength converting member 52. As a result, the deriving efficiency of the light outputted from the light output plane 52a can also be increased by the above-described forming of the side plane 52b. Alternatively, an average roughness "Ra" of a portion of the side plane 52b may be smaller than, or equal to ¼ of the central wavelength of the light emitted by the semiconductor light emitting element 48.

Also, in the optical wavelength converting member 52, the average roughness "Ra2" of the side plane 52b may be alternatively smaller than, or equal to ⅛ of the central wavelength of the light after the wavelength of the light has been converted by the optical wavelength converting member 52. Since the central wavelength of the light after the wavelength of the light has been converted by the optical wavelength converting member 52 becomes 600 nm in the exemplary embodiment, the average roughness "Ra2" of the side plane 52b in the optical wavelength converting member 52 may alternatively become smaller than, or equal to 75 nm which corresponds to ⅛ of this central wavelength.

Furthermore, in the optical wavelength converting member 52, the average roughness "Ra2" of the side plane 52b may be alternatively smaller than, or equal to ⅛ of the central wavelength of the light emitted by the semiconductor light emitting element 48. Since the central wavelength of the light emitted by the semiconductor light emitting element 48 becomes 470 nm in the exemplary embodiment, the average roughness "Ra2" of the side plane 52b in the optical wavelength converting member 52 may alternatively become smaller than, or equal to 58.8 nm which corresponds to ⅛ of this central wavelength.

As shown in FIG. 6B, it can be understood that when the height "h" of the projection portions is made smaller than approximately ¼ of the wavelength of the light, namely, the average roughness "Ra" is made smaller than ⅛ of the wavelength of the light, the reflectance factor "R" can be suddenly increased. As a result, the side plane 52b is formed in order to become such an average roughness "Ra", so that a reflectance factor of the side plane 52b can be furthermore increased, and the deriving efficiency of the light from the light output plane 52a can be furthermore increased.

Alternatively, in the optical wavelength converting member 52, the average roughness "Ra2" of the side plane 52b may be smaller than, or equal to 0.3 μm. As a result of research, it could be revealed that since the average roughness "Ra" of the outer plane of the optical wavelength converting member 52 becomes smaller than, or equal to 0.3 μm, a reflectance factor caused by this outer plane can be increased. As a consequence, since the average roughness "Ra2" of the side plane 52b is set to such a low value, the light outputted from the side plane 52b can be suppressed, so that a larger amount of light can be reflected in the inner portion of the optical wavelength converting member 52. As a result, the deriving efficiency of the light outputted from the light output plane 52a can be increased. Alternatively, the average roughness "Ra" of a portion of the side plane 52b may be smaller than, or equal to 0.3 μm. Such an average roughness "Ra" can be adjusted by employing the existing descriptions such as blasting, grinding, polishing, laser processing, split-cutting, and etching.

The optical wavelength converting member 52 is provided under such a condition that Shore-D-hardness becomes larger than, or equal to 60. Since such hardness is given to the optical wavelength converting member 52, the optical wavelength converting member 52 can be more easily processed, or formed in such a manner that the average roughness "Ra1" of the light output plane 52a and the average roughness "Ra2" of the side plane 52b become the above-explained values.

In the optical wavelength converting member 52, the average roughness "Ra1" of the light output plane 52a becomes larger than ¼ of the central wavelength of the light after the wavelength of the light has been converted by the optical wavelength converting member 52. As previously explained, since the first height "h1" is made larger than approximately ½ of the wavelength of the light, namely, the average roughness "Ra" is made larger than ¼ of the wavelength of the light, the reflectance factor of the light output plane 52a can be decreased, so that transmission of the light can be promoted. As a consequence, since the side plane 52b is formed in such a manner that the above-described average roughness "Ra" is obtained by utilizing this characteristic, the reflections of the light on the light output plane 52a can be suppressed, so that the high light deriving efficiency can be realized.

Alternatively, the average roughness "Ra1" of a portion of the light output plane 52a may become larger than ¼ of the central wavelength of the light after the wavelength of the light has been converted by the optical wavelength converting member 52. Also, the light output plane 52a may be alternatively formed in such a manner that the average roughness "Ra" becomes larger than 0.3 μm. Also, in the optical wavelength converting member 52, the average roughness "Ra1" of the light output plane 52a may alternatively become larger than ¼ of the central wavelength of the light emitted by the semiconductor light emitting element 48.

Concretely speaking, in the optical wavelength converting member 52, the light output plane 52a is provided in such a manner that the plurality of first projection portions 52d are actually formed. As previously described, since the first projection portions 52d are provided, it is possible to avoid that the light entered from the semiconductor light emitting element 48 is not outputted from the light output plane 52a, but is again reflected toward the semiconductor light emitting element 48, so that the light deriving efficiency is lowered.

Each of the plurality of first projection portions 52d is formed in the quadrilateral pyramids. Apparently, the first projection portions 52d are not limited only to such a shape, but may be alternatively formed in, for example, cone shapes, or other pyramid shapes. Also, the first projection portions 52d may be alternatively formed in semispherical shapes, or may be formed in other shapes whose tip portions become narrower toward external portions.

In the semiconductor light emitting element 48, electrode patterns to which currents for emitting light are supplied are formed on a light emitting plane 48a. To this end, the plurality of first projection portions 52d are provided in an arranging interval "X1" which is shorter than a repetition interval of patterns in the electrode patterns. As previously described, since the arranging interval "X1" is made shorter than the repetition interval of the patterns in the electrode patterns, luminance fluctuations caused by the electrode patterns can be suppressed. Apparently, there is no restriction that the electrode patterns of the semiconductor light emitting element 48 are provided on the light emitting plane 48a.

Also, in the exemplary embodiment, the arranging interval "X1" is set to be longer than, or equal to 1 μm, and shorter than, or equal to 300 μm. However, it could be confirmed that since the first projection portions 52d are arranged in the above-explained manner, the light deriving efficiency can be increased and the luminance fluctuations can be suppressed. It could be confirmed that since the arranging interval "X1" is set to be longer than, or equal to 1 μm and shorter than, or equal to 100 μm, a more preferable result can be obtained in the light deriving efficiency and the suppression of the luminance fluctuations. Alternatively, the arranging interval "X1" may be set to be shorter than 1 μm. Also, in the exemplary embodiment, widths of the first projection portions 52d are similar to the arranging interval "X1." As a result, the widths of the first projection portions 52d are set to be longer than, or equal to 1 μm, and shorter than, or equal to 300 μm. Alternatively, the widths of the first projection portions 52d may be made shorter than the arranging interval "X1."

In the case that the light emitting module 40 is manufactured, a material of the optical wavelength converting member 52 is firstly prepared, while lengths of edge portions of the material have been made two, or more longer than, or equal to the light emitting plane 48a of the semiconductor light emitting element 48, and the plurality of first projection portions 52d have been formed on one plane thereof. Subsequently, the above-described material is cut in a size similar to that of the light emitting plane 48a of the semiconductor light emitting element 48 by dicing, and the like so as to form the optical wavelength converting member 52.

Alternatively, a this time, a dicing blade having a surface polishable surface roughness may be employed in order that the average roughness "Ra2" of the side plane 52b becomes smaller than, or equal to ¼ of the wavelength of the light after the wavelength of the light has been converted by the optical wavelength converting member 52, or the average roughness "Ra" becomes smaller than, or equal to 0.3 μm. As a result, a polishing step after the dicing step may be omitted. It should be noted that a step for polishing the side plane 52b may be alternatively provided after the dicing step. The light incident plane 52c of the optical wavelength converting member 52 manufactured in the above-described manufacturing steps is fixed on the light emitting plane 48a of the semiconductor light emitting element 48 by an adhesive manner.

Alternatively, a gap may be formed between the light emitting plane 48a of the semiconductor light emitting element 48 and the light incident plane 52c of the optical wavelength converting member 52. As a result, Au-wires bonded on the electrodes provided on the light emitting plane 48a of the semiconductor light emitting element 48 may be easily routed. This gap may be provided all over the entire area of the light emitting plane 48a of the semiconductor light emitting element 48, or may be alternatively provided in such a manner that at least a portion of the electrodes provided on the light emitting plane 48a of the semiconductor light element 48 is exposed.

FIG. 5 is a diagram for representing an experimental result related to examples 1 to 3 of the optical wavelength converting member 52 according to the exemplary embodiment, in which combinations between the average roughness "Ra" of the light output plane 52a and the average roughness "Ra" of the side plane 52b are different from each other, and comparison examples 1 to 3 with respect to the above-described examples 1 to 4. In the examples 1 to 3, while a blue light emitting diode having a center peak wavelength of 470 nm was employed as the semiconductor light emitting element 48, a semiconductor module having the structure shown in FIG. 3 was assembled. A sintered YAG plate was employed as the optical wavelength converting member 52 to be mounted.

As to the light output plane 52a of the YAG plate, in the examples 1 to 3, since the YAG plates were polished by employing diamond powder whose particle diameter is 165 μm, average roughnesses "Ra" indicated in FIG. 5 were obtained. In the comparison examples 1 to 4, the YAG plates were polished under mirror face conditions by employing diamond powder whose particle diameter is 0.1 μm. Thicknesses of the YAG plates after polishing were unified by 200 μm.

The YAG plates prepared in the above-explained manner were cut respectively in the size of the semiconductor light emitting element 48 based upon the below-mentioned method, and then, the cut YAG plates were mounted on the light emitting module 40. In the comparison example 1, after the YAG plate was scratched by a glass cutter (diamond pen), the cut YAG plate was split-cut. In the example 1 and the comparison example 2, after the YAG plate was half-cut by a dicing blade whose count is #600, the half-cut YAG plate was split-cut. In the example 2 and the comparison example 3, the YAG plate was cut by the dicing blade whose count is #600. In the example 3 and the comparison example 4, the YAG plate was cut by the dicing blade whose count is #1500.

In evaluation, spectral radiance (spectral radiation flux) was measured by employing a spectroradio-luminance meter. A photon number "n" was calculated from the resultant spectral radiance every wavelength of 1 nm based upon the below-mentioned equation (1), and a total photon number of a visible range (higher than, or equal to 380 nm, and lower than, or equal to 780 nm) was obtained:

$$\epsilon = n \cdot h \cdot (c/\lambda) \quad \text{(equation 1)}$$

n: Photon number (photon quantity)
$\epsilon$: Spectral radiation flux [W/sr/m$^3$]
$\lambda$: Wavelength [m]
c: Light velocity (2.998×10$^8$ [m/s])
h: Plank's constant (6.626×10$^{-34}$[J·s])

In FIG. 5, assuming that the photon number of the light output plane 52a of the YAG plate calculated in the comparison example 1 is 1, relative photon number ratios were indicated in columns of "light output plane photon ratio" and "side plane photon ratio." Also, the light output plane photon ratio/side plane photon ratio was indicated in a column of "light output plane/side plane photon ratio."

Effective light as the light emitting module 48 is the light outputted from the light output plane 52a, and the light of the side plane 52b becomes glare. As a consequence, it is preferable to reduce the light of the side plane 52b, and a half, or larger accounts of the light outputted from the light output plane 52a is necessarily required, namely, the light output plane/side plane photon ratio is necessarily required to become larger than, or equal to 0.5.

As apparent from FIG. 5, in the examples 1 to 3 in which the average roughnesses "Ra1" of the light output planes 52a are made larger than the average roughnesses "Ra2" of the side planes 52b, deriving of the light from the light output planes 52a is increased, as compared with those of the comparison examples 1 to 4, namely, not only the light output plane photon numbers are large, but also the light output plane/side plane photon ratios exceed 0.5. Moreover, the following fact could be revealed: That is, in the examples 1 to 3, it could be succeeded that deriving of the light from the light output planes 52a could be increased, namely, the light output plane photon ratios could be increased in accordance with such a condition that the average roughness "Ra" of the side plane 52b is increased.

According to the exemplary embodiment, a light emitting module may include a light emitting element; and an optical wavelength converting member.

The optical wavelength converting member may include a light incident plane, a light output plane, and an outer plane which is a plane except for the light incident plane and the light output plane. The optical wavelength converting member may be adapted to convert a wavelength of light emitted on the light emitting element and entered from the light incident plane into the optical wavelength converting member and to output the wavelength-converted light from the light output plane. An average roughness "Ra" of at least a portion of the outer plane may be lower than an average roughness of the light output plane.

According to the exemplary embodiment, the average roughness "Ra" of the portion of the outer plane is smaller than, or equal to 0.3 micrometers.

When the average roughness "Ra" of the portion of the outer plane is set to be smaller than, or equal to 0.3 micrometers, the light outputted from the outer plane can be suppressed, and can be again reflected to an internal portion of the optical wavelength converting member. As a result, the light outputted from the light output plane can be increased, so that a higher deriving efficiency of the light can be realized.

According to the exemplary embodiment, the average roughness "Ra" of the portion of the outer plane may be smaller than, or equal to ¼ of a central wavelength of the wavelength-converted light.

When the projection portions are present on the outer plane, by setting the height "h" of the projection portions to be smaller than, or equal to approximately ½ of the wavelength of the light, namely, setting the average roughness "Ra" to be smaller than ¼ of the wavelength of the light, the reflectance factor "R" can be increased. Thus, the light outputted from the outer plane can be suppressed, and can be again reflected to an internal portion of the optical wavelength converting member. As a result, the light outputted from the light output plane can be increased, so that a higher deriving efficiency of the light can be realized. Also, in such a case where this light emitting module is employed in a vehicle headlamp, since light from the outer planes except for the light output plane is suppressed, glares which are given to persons located in front of the vehicle can be suppressed.

According to the exemplary embodiment, the optical wavelength converting member may have a shore-D-hardness which is larger than, or equal to 60.

When the shore-D-hardness of the optical wavelength converting member is set to be larger than, or equal to 60, the average roughness "Ra" may be easily adjusted.

In accordance with the exemplary embodiments, the high deriving efficiency of the light can be realized.

While description has been made in connection with the specific exemplary embodiment and the examples thereof, it will be obvious to those skilled in the art that various changes and modifications may be made therein without departing from the present invention. It is aimed, therefore, to cover in the appended claims all such changes and modifications falling within the true spirit and scope of the present invention. One of such modifications is described in the below.

In the one of the modifications, an optical filter is provided between the light emitting plane of the semiconductor light emitting element and the light incident plane of the optical wavelength converting member of the above-described exemplary embodiments.

The optical filter passes therethrough blue light which is mainly emitted by the semiconductor light emitting element, and reflects thereon yellow light which is mainly produced by the optical wavelength converting member by which the wavelength of the blue light is converted. As previously described, since the optical filter is provided, the light emitted by the semiconductor light emitting element can be more effectively utilized, it is possible to suppress that luminous intensity and luminance of light are lowered, which is emitted by the light emitting module.

DESCRIPTION OF REFERENCE NUMERALS AND SIGNS 10 vehicle headlamp,
40 light emitting module,
48 semiconductor light emitting element,
48a light emitting plane,
52 optical wavelength converting member,
52a light output plane,
52b side plane,
52c light incident plane,
52d first projection portion,
52e second projection portion.

What is claimed is:

1. A light emitting module comprising:
   a light emitting element; and
   an optical wavelength converting member,
   wherein the optical wavelength converting member includes a light incident plane facing the light emitting element, a light output plane, and an outer plane which is a plane except for said light incident plane and said light output plane,
   wherein the optical wavelength converting member is adapted to convert a wavelength of light emitted from the light emitting element and entered from the light incident plane into the optical wavelength converting member and to output the wavelength-converted light from the light output plane,
   wherein an average roughness "Ra" of the light output plane is larger than 0.3 micrometers,
   wherein an average roughness "Ra" of at least a portion of the outer plane is lower than an average roughness of the light output plane,
   wherein said average roughness "Ra" of said portion of the outer plane is smaller than, or equal to 0.3 micrometers, and larger than or equal to 0.020 micrometers, and
   wherein a photon ratio between the light output plane and the outer plane exceeds 0.5.

2. The light emitting module according to claim 1, wherein the optical wavelength converting member has a shore-D-hardness which is larger than, or equal to 60.

3. A light emitting module comprising:
   a light emitting element; and
   an optical wavelength converting member,
   wherein the optical wavelength converting member includes a light incident plane facing the light emitting element, a light output plane, and an outer plane which is a plane except for said light incident plane and said light output plane,
   wherein the optical wavelength converting member is adapted to convert a wavelength of light emitted from the light emitting element and entered from the light incident plane into the optical wavelength converting member and to output the wavelength-converted light from the light output plane,
   wherein an average roughness "Ra" of the light output plane is larger than 0.3 micrometers,
   wherein an average roughness "Ra" of at least a portion of the outer plane is lower than an average roughness of the light output plane,
   wherein said average roughness "Ra" of said portion of the outer plane is smaller than, or equal to ¼ of a central wavelength of said wavelength-converted light, and larger than or equal to 0.020 micrometers, and
   wherein a photon ratio between the light output plane and the outer plane exceeds 0.5.

4. The light emitting module according to claim 3, wherein the optical wavelength converting member has a shore-D-hardness which is larger than, or equal to 60.

5. An optical wavelength converting member comprising:
   a light incident plane;
   a light output plane, and
   an outer plane which is a plane except for said light incident plane and said light output plane,
   wherein the optical wavelength converting member is adapted to convert a wavelength of light entered from the light incident plane into the optical wavelength converting member and to output the wavelength-converted light from the light output plane, wherein an average roughness "Ra" of the light output plane is larger than 0.3 micrometers.

wherein an average roughness "Ra" of at least a portion of the outer plane is lower than an average roughness of the light output plane, and wherein said average roughness "Ra" of said portion of the outer plane is smaller than, or equal to 0.3 micrometers, and larger than or equal to 0.020 micrometers, and wherein a photon ratio between the light output plane and the outer plane exceeds 0.5.

6. The light emitting module according to claim 1, wherein a ratio of said average roughness of the light output plane divided by said average roughness of said portion of the outer plane is greater than or equal to 2 and less than or equal to 30.

7. The light emitting module according to claim 3, wherein a ratio of said average roughness of the light output plane divided by said average roughness of said portion of the outer plane is greater than or equal to 2 and less than or equal to 30.

8. The optical wavelength converting member according to claim 5, wherein a ratio of said average roughness of the light output plane divided by said average roughness of said portion of the outer plane is greater than or equal to 2 and less than or equal to 30.

9. The light emitting module according to claim 1, wherein the light output plane comprises a plurality of projected portions, and wherein an arranging interval of the projection portion is shorter than a repetition interval of patterns in electrode patterns to which currents for emitting light are supplied.

10. The light emitting module according to claim 3, wherein the light output plane comprises a plurality of projected portions, and wherein an arranging interval of the projection portion is shorter than a repetition interval of patterns in electrode patterns to which currents for emitting light are supplied.

11. The optical wavelength converting member according to claim 5, wherein the light output plane comprises a plurality of projected portions, and wherein an arranging interval of the projection portion is shorter than a repetition interval of patterns in electrode patterns to which currents for emitting light are supplied.

12. The light emitting module according to claim 1, wherein the optical wavelength converting member is a plate shape member having a substantially the same size with a light emitting plane of the light emitting element.

13. The light emitting module according to claim 3, wherein the optical wavelength converting member is a plate shape member having a substantially the same size with a light emitting plane of the light emitting element.

14. The optical wavelength converting member according to claim 5, wherein the optical wavelength converting member is a plate shape member having a substantially the same size with a light emitting plane of the light emitting element.

* * * * *